(12) United States Patent
Asai et al.

(10) Patent No.: US 9,443,781 B2
(45) Date of Patent: Sep. 13, 2016

(54) DISPLAY DEVICE

(71) Applicant: Sharp Kabushiki Kaisha, Osaka-shi, Osaka (JP)

(72) Inventors: Yoshihiro Asai, Osaka (JP); Katsuhiro Okada, Osaka (JP); Isao Ogasawara, Osaka (JP); Masahiro Yoshida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/764,198

(22) PCT Filed: Jan. 24, 2014

(86) PCT No.: PCT/JP2014/051467
§ 371 (c)(1),
(2) Date: Jul. 29, 2015

(87) PCT Pub. No.: WO2014/119478
PCT Pub. Date: Aug. 7, 2014

(65) Prior Publication Data
US 2015/0364396 A1    Dec. 17, 2015

(30) Foreign Application Priority Data

Jan. 30, 2013    (JP) .................. 2013-015727

(51) Int. Cl.
| | |
|---|---|
| H01L 23/00 | (2006.01) |
| H01L 23/31 | (2006.01) |
| G02F 1/1333 | (2006.01) |
| G02F 1/1345 | (2006.01) |
| G09G 3/36 | (2006.01) |

(Continued)

(52) U.S. Cl.
CPC ....... *H01L 23/3142* (2013.01); *G02F 1/13336* (2013.01); *G02F 1/13454* (2013.01); *G09G 3/36* (2013.01); *H01L 27/124* (2013.01); *H01L 27/1225* (2013.01); *H01L 27/1255* (2013.01); *H01L 29/78633* (2013.01); *G09G 3/3666* (2013.01); *G09G 3/3677* (2013.01); *G09G 2300/0426* (2013.01); *H01L 2924/0002* (2013.01)

(58) Field of Classification Search
None
See application file for complete search history.

(56) References Cited

U.S. PATENT DOCUMENTS

| 7,006,193 B2 * | 2/2006 | von Gutfeld ......... G02F 1/1339 349/190 |
| 2003/0137630 A1 * | 7/2003 | Niiya .................... G02F 1/1339 349/153 |

(Continued)

FOREIGN PATENT DOCUMENTS

| JP | 50-75818 A | 4/1985 |
| JP | 2001-255514 A | 9/2001 |

(Continued)

OTHER PUBLICATIONS

Official Communication issued in International Patent Application No. PCT/JP2014/051467, mailed on Mar. 11, 2014.

*Primary Examiner* — Evren Seven
(74) *Attorney, Agent, or Firm* — Keating & Bennett, LLP

(57) ABSTRACT

In a liquid crystal display device (1) according to one aspect of the present invention, each of a first gate driver (17) supplying a gate signal to a first gate line (10) of a first display part (8) and a second gate driver (18) supplying a gate signal to a second gate line (13) of a second display part (9) are constituted to comprise a transistor formed on one surface of an array substrate (2).

4 Claims, 13 Drawing Sheets

(51) Int. Cl.
 *H01L 27/12* (2006.01)
 *H01L 29/786* (2006.01)

(56) References Cited

U.S. PATENT DOCUMENTS

| | | | |
|---|---|---|---|
| 2005/0219150 A1 | 10/2005 | Park et al. | |
| 2005/0231679 A1* | 10/2005 | Kojima | C09J 163/00 349/153 |
| 2007/0115229 A1* | 5/2007 | Takatori | G09G 3/3611 345/87 |
| 2008/0151172 A1* | 6/2008 | Kondo | G02F 1/1339 349/153 |
| 2008/0309866 A1* | 12/2008 | Huang | G02F 1/1339 349/153 |
| 2009/0284500 A1 | 11/2009 | Yamashita | |
| 2010/0103362 A1* | 4/2010 | Byun | G02F 1/1339 349/153 |
| 2012/0194772 A1* | 8/2012 | Moriwaki | G02F 1/1339 349/138 |
| 2012/0194773 A1 | 8/2012 | Kim et al. | |
| 2013/0094166 A1 | 4/2013 | Yokoyama et al. | |
| 2013/0328840 A1 | 12/2013 | Fujikawa | |
| 2015/0364396 A1* | 12/2015 | Asai | G02F 1/13336 257/43 |

FOREIGN PATENT DOCUMENTS

| | | | |
|---|---|---|---|
| JP | 2003-216116 A | | 7/2003 |
| JP | 2005-196212 A | | 7/2005 |
| JP | 2009-276547 A | | 11/2009 |
| JP | 2010-079314 | * | 4/2010 |
| JP | 2010-079314 A | | 4/2010 |
| JP | 2011-215380 | * | 10/2011 |
| JP | 2011-215380 A | | 10/2011 |
| WO | 2011/043440 A1 | | 4/2011 |
| WO | 2012/002042 A1 | | 1/2012 |
| WO | 2012/115052 A1 | | 8/2012 |

* cited by examiner

DISPLAY DEVICE

TECHNICAL FIELD

The present invention relates to a display device.

The subject application claims priority based on the patent application No. 2013-015727 filed in Japan on Jan. 30, 2013 and incorporates by reference herein the content thereof.

BACKGROUND ART

In recent years, liquid crystal display devices, which are a type of display device, have come into widespread use as display units in mobile electronic devices. For example, Patent Documents 1 and 2 disclose liquid crystal display devices having two display parts that can be individually displayed. The display device described in Patent Document 1 has a first display part that is a transmission-type liquid crystal display unit and a second display part that is a reflective-type liquid crystal display unit. In this display device, information that is to be displayed at all times, such as the time and date, are displayed on the second display part. Other information, such as characters and graphics needed temporarily, are switched between displayed and non-displayed on the first display part. Patent Document 1 describes this display device as being suitable for use in a mobile telephone, a portable computer, or the like.

PRIOR ART DOCUMENTS

Patent Documents

[Patent Document 1] Japanese Patent Application Publication No. 2003-216116
[Patent Document 2] Japanese Patent Application Publication No. 2009-276547

SUMMARY OF THE INVENTION

Problem to be Solved by the Invention

In the display device described in Patent Document 1, a first scanning line driver for the first display part is mounted along a first side of the substrate and a second scanning line driver for the second display part is mounted along a second side of the substrate, which is opposite from the first side. That is, two scanning line driver IC chips are mounted on the peripheral edge part of the substrate. As the scanning line driver, rather than a constitution in which an IC chip is mounted, there is a case in which a driver circuit is monolithically formed on the array substrate. In this case, because water tends to seep in from the peripheral edge part of the substrate, there is a danger of corrosion of interconnects and deterioration in the performance of elements forming the driver circuit, thereby lowering the reliability of the scanning line driver. The scanning line driver is the same as the gate driver.

Particularly if the frame part of the display device is made narrow, a constitution can be envisioned in which the elements such as transistors and the like within the driver circuit are disposed directly below a sealing material. In the following, the making of the frame part of the display device narrow will be referred to as frame narrowing. Using such a structure, there is a problem of elements being damaged because stress is applied to the elements when two substrates are sealed via the sealing material. If a UV-cured sealing material or the like is used, there is a problem of light being blocked by the driver circuit pattern, making the sealing material difficult to cure.

One aspect of the present invention has been made to solve the above-noted problems and has as an object the provision of a display device with little risk of a decrease in the reliability of the gate driver. An additional object of one aspect of the present invention is to provide a display device in which it is difficult for trouble such as damaged elements within the driver circuit and poor curing of the light-cured sealing material to occur.

Means to Solve the Problem

To achieve the above-described object, a display device according to one aspect of the present invention includes: an array substrate in which a first display part and a second display part are disposed side by side on one surface, wherein the first display part includes a plurality of first gate lines that extend in an arrangement direction of the first display part and the second display part, a plurality of first data lines that extend in a direction perpendicular to the arrangement direction, a first thin film transistor that is connected to the first gate lines and the first data lines, and a first pixel electrode that is directly or indirectly connected to the first thin film transistor, wherein the second display part includes a plurality of second gate lines that extend in an arrangement direction of the first display part and the second display part, a plurality of second data lines that extend in a direction perpendicular to the arrangement direction, a second thin film transistor that is connected to the second gate lines and the second data lines, and a second pixel electrode that is directly or indirectly connected to the second thin film transistor, wherein each of a first gate driver supplying a gate signal to the first gate lines and a second gate driver supplying a gate signal to the second gate lines are constituted to include a transistor formed on one surface of the array substrate, and wherein at least a part of the first gate driver and at least a part of the second gate driver are formed in a region sandwiched between the first display part and the second display part.

The display device according to the present invention may further include: an opposing substrate, a sealing material adhering the array substrate and the opposing substrate with a prescribed spacing, and a display medium sealed within a space surrounded by the array substrate, the opposing substrate, and the sealing material.

In the display device according to the present invention, the sealing material, the first gate driver, and the second gate driver may be disposed in positions that do not overlap in a case of being viewed from normal line direction of the opposing substrate.

In the display device according to the present invention, the sealing material may include a first sealing material surrounding an outer periphery of the first display part and a second sealing material surrounding an outer periphery of the second display part.

In the display device according to the present invention, one sealing material may be shared between a part facing the second display part of the first sealing material and a part facing the first display part of the second sealing material.

In the display device according to the present invention, the sealing material may integrally surround an outer periphery of the first display part and the second display part.

In the display device according to the present invention, a light-blocking layer may be provided on one surface of the opposing substrate, and the light-blocking layer and the first gate driver, and the light-blocking layer and the second gate driver may be disposed in positions that overlap in a case of being viewed from a normal line direction of the opposing substrate.

In the display device according to the present invention, the number of the first gate lines may be smaller than the number of the second gate lines.

In the display device according to the present invention, a data driver supplying a data signal to the first data lines and the second data lines may be disposed on one side at a near side to the first display part of two sides opposing to the arrangement direction of the array substrate with a rectangular-shape.

In the display device according to the present invention, the array substrate may further include first data leads connecting the first data lines and first data line terminals, second data leads connecting the second data lines and second data line terminals, first gate driver signal lines connecting the first gate driver and an external connection terminal, and second gate driver signal lines connecting the second gate driver and an external connection terminal, wherein the second data leads may be disposed in a first side of two sides opposing to a direction perpendicular to the arrangement direction of the array substrate, and wherein the first data leads, the first gate driver signal lines and the second gate driver signal lines may be disposed in a second side of the two sides.

In the display device according to the present invention, the array substrate may further include first common leads supplying a common signal to a first opposing electrode on the opposing substrate corresponding to the first display part, wherein a part of the first common leads may be arranged in a region sandwiched between a plurality of first data line terminals and a plurality of second data line terminals on one surface of the array substrate.

In the display device according to the present invention, the array substrate ma include a data driver supplying a data signal to the first data lines and the second data lines, wherein the data driver may be mounted on a first side of two sides opposing to the direction perpendicular to the arrangement direction of the array substrate with a rectangular-shape.

In the display device according to the present invention, the array substrate may further include a first gate driver signal line connecting the first gate driver and an external connection terminal, and a second gate driver signal line connecting the second gate driver and an external connection terminal, wherein a part of the first gate driver signal line and a part of the second gate driver signal line may be disposed in a region sandwiched between a plurality of first data line terminals and a plurality of second data line terminals on one surface of the array substrate.

In the display device according to the present invention, the array substrate may further include a plurality of first gate driver signal lines connecting the first gate driver and an external connection terminal and a plurality of second gate driver signal lines connecting the second gate driver and an external connection terminal, wherein, of the plurality of first gate driver signal lines and the plurality of second gate driver signal lines, a signal line having a same function may be shared by the first gate driver and the second gate driver.

A display device according to the present invention includes: an array substrate in which a first display part and a second display part are disposed side by side on one surface, wherein the first display part includes a plurality of first gate lines that extend in an arrangement direction of the first display part and the second display part, a plurality of first data lines that extend in a direction perpendicular to the arrangement direction, a first thin film transistor that is connected to the first gate lines and the first data lines, and a first pixel electrode that is directly or indirectly connected to the first thin film transistor, wherein the second display part includes a plurality of second gate lines that extend in an arrangement direction of the first display part and the second display part, a plurality of second data lines that extend in a direction perpendicular to the arrangement direction, a second thin film transistor that is connected to the second gate lines and the second data lines, and a second pixel electrode that is directly or indirectly connected to the second thin film transistor, and wherein a gate driver supplying a gate signal to the first gate lines and to the second gate lines includes a transistor formed on one surface of the array substrate, and at least a part of the gate driver is formed in a region sandwiched between the first display part and the second display part.

In the display device according to the present invention, the number of first gate lines and the number of the second gate lines may be different, of a plurality of output transistors of the gate driver, both of the first gate lines and the second gate lines may be connected to a part of output transistors, and either one of the first gate lines and the second gate lines are connected to remaining output transistors, and a load capacitance adjuster may be connected to output transistors that are connected to either one of the first gate lines and the second gate lines.

In the display device according to the present invention, the gate driver may be divided in a direction perpendicular to the arrangement direction into a first gate line output unit that includes an output transistor connected to the first gate lines and a second gate line output unit that includes an output transistor connected to the second gate lines.

In the display device according to the present invention, a semiconductor layer of the transistor may be made of an oxide semiconductor including indium, gallium and zinc.

Effect of the Invention

According to one aspect of the present invention, a display device is provided having little risk of decrease in the reliability of the scanning line driver. Also, according to one aspect of the present invention, a display device is provided in which it is difficult for trouble such as damaged elements within the driver circuit and poor curing of the light-cured sealing material to occur.

EMBODIMENT(S) FOR CARRYING OUT THE INVENTION (First Embodiment)

The first embodiment of the present invention will be described below, with references made to FIG. 1 to FIG. 5.

In the present embodiment, a liquid crystal display device will be described as an example of a display device.

Figure 1:
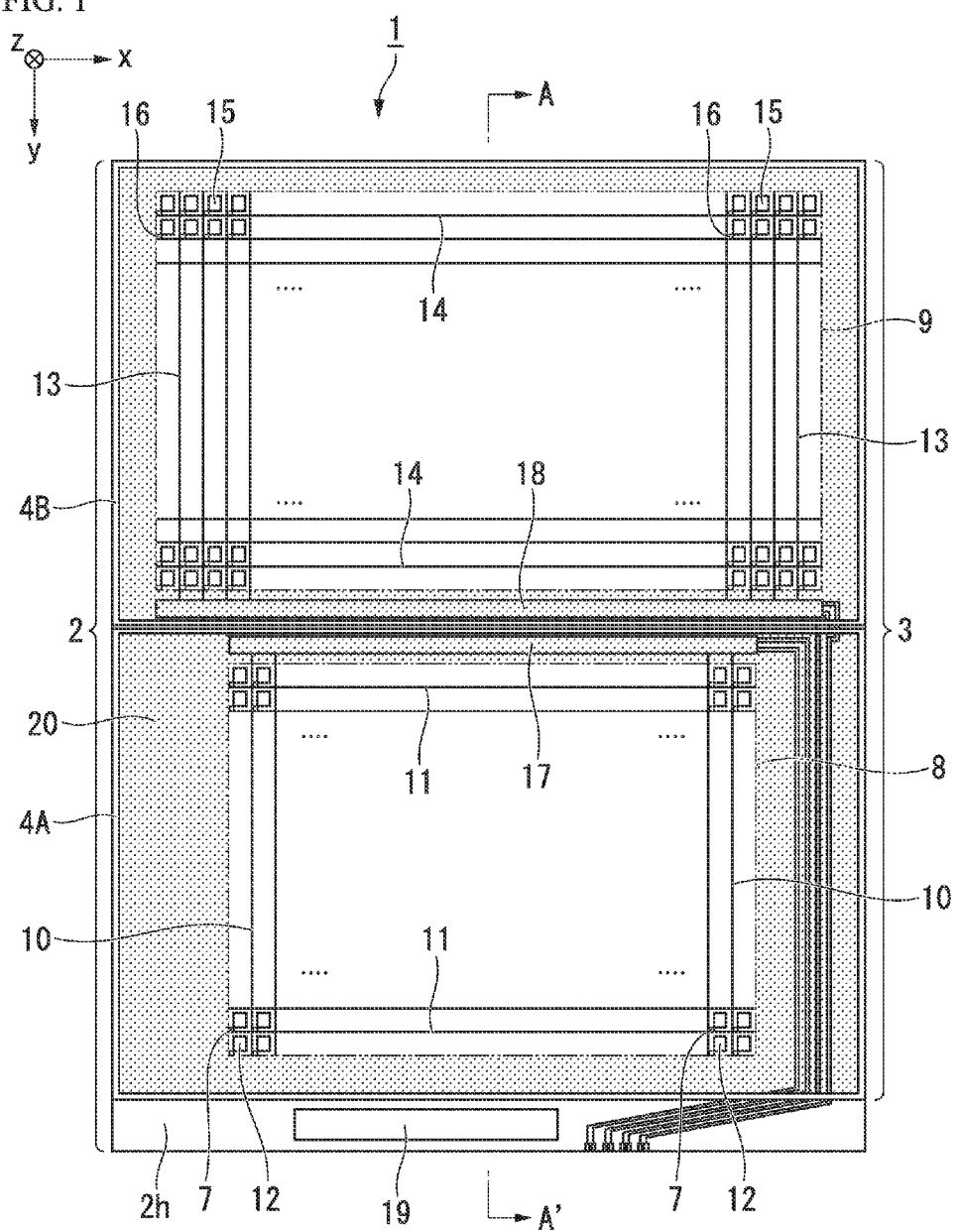
FIG. 1 is a plan view of a liquid crystal display device of a first embodiment.
Figure 2:
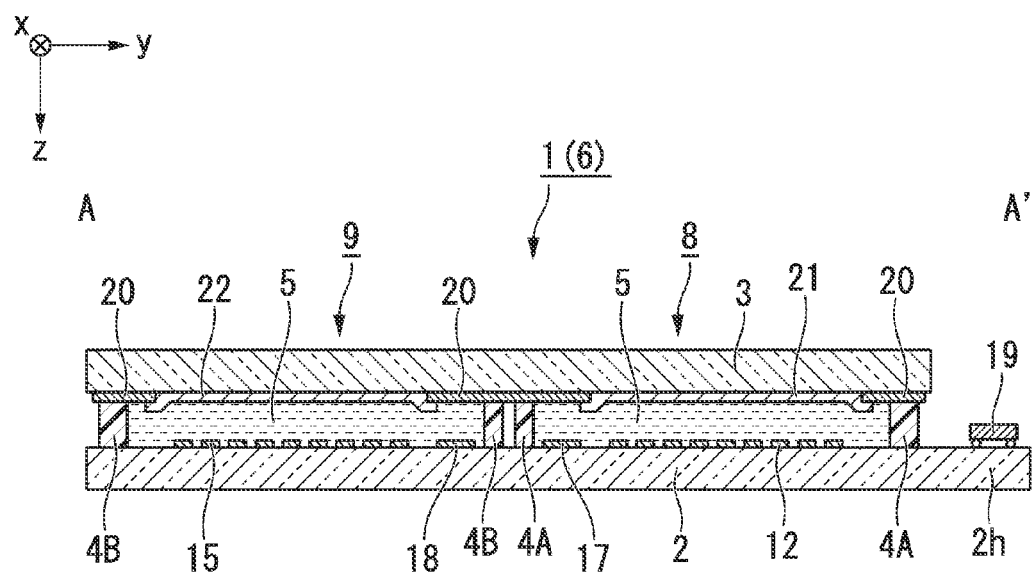
FIG. 2 is a cross-sectional view along the line A-A' in FIG. 1.
Figure 3:
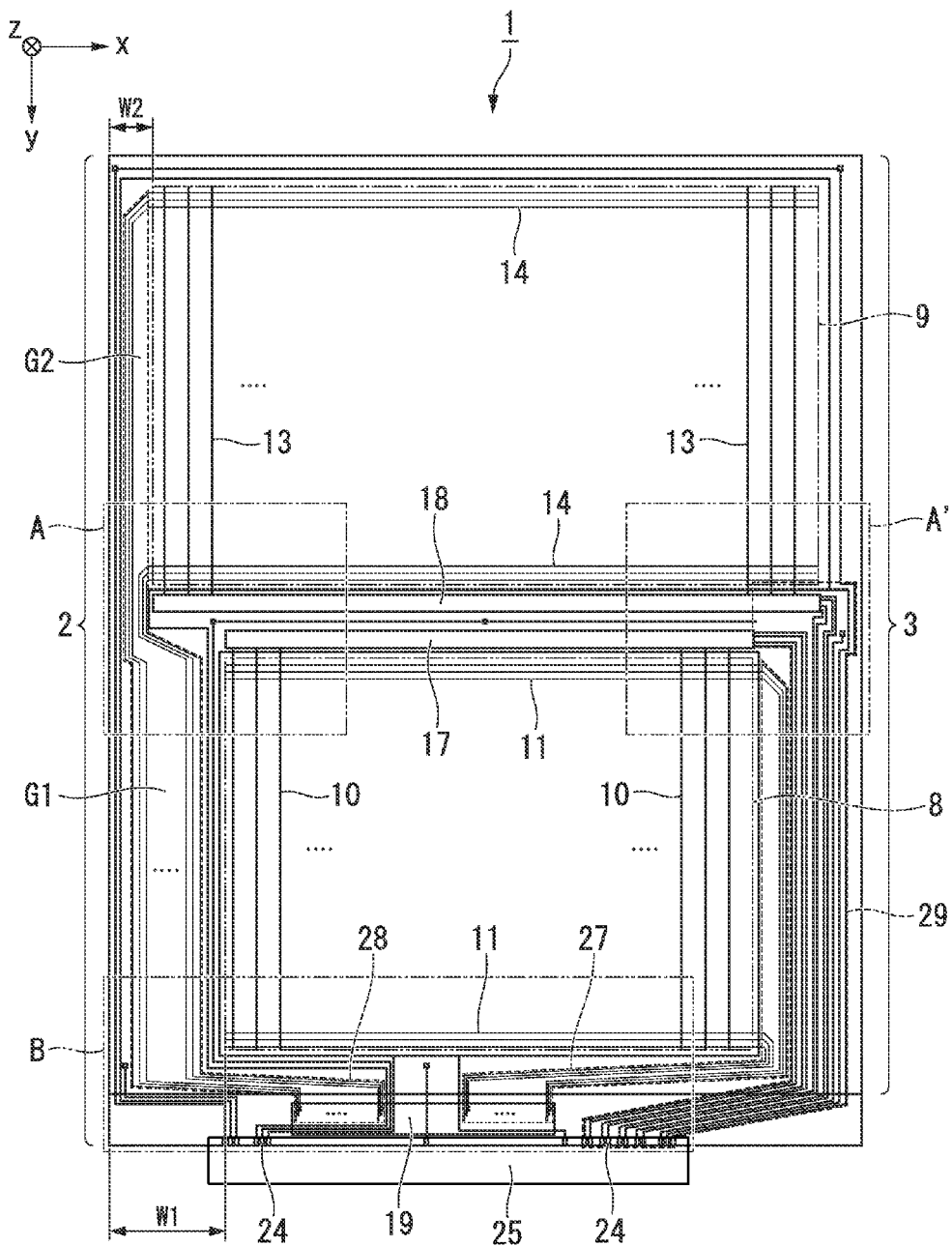
FIG. 3 is a plan view of the circuit constitution in the peripheral edge part of the display device.
Figure 4:
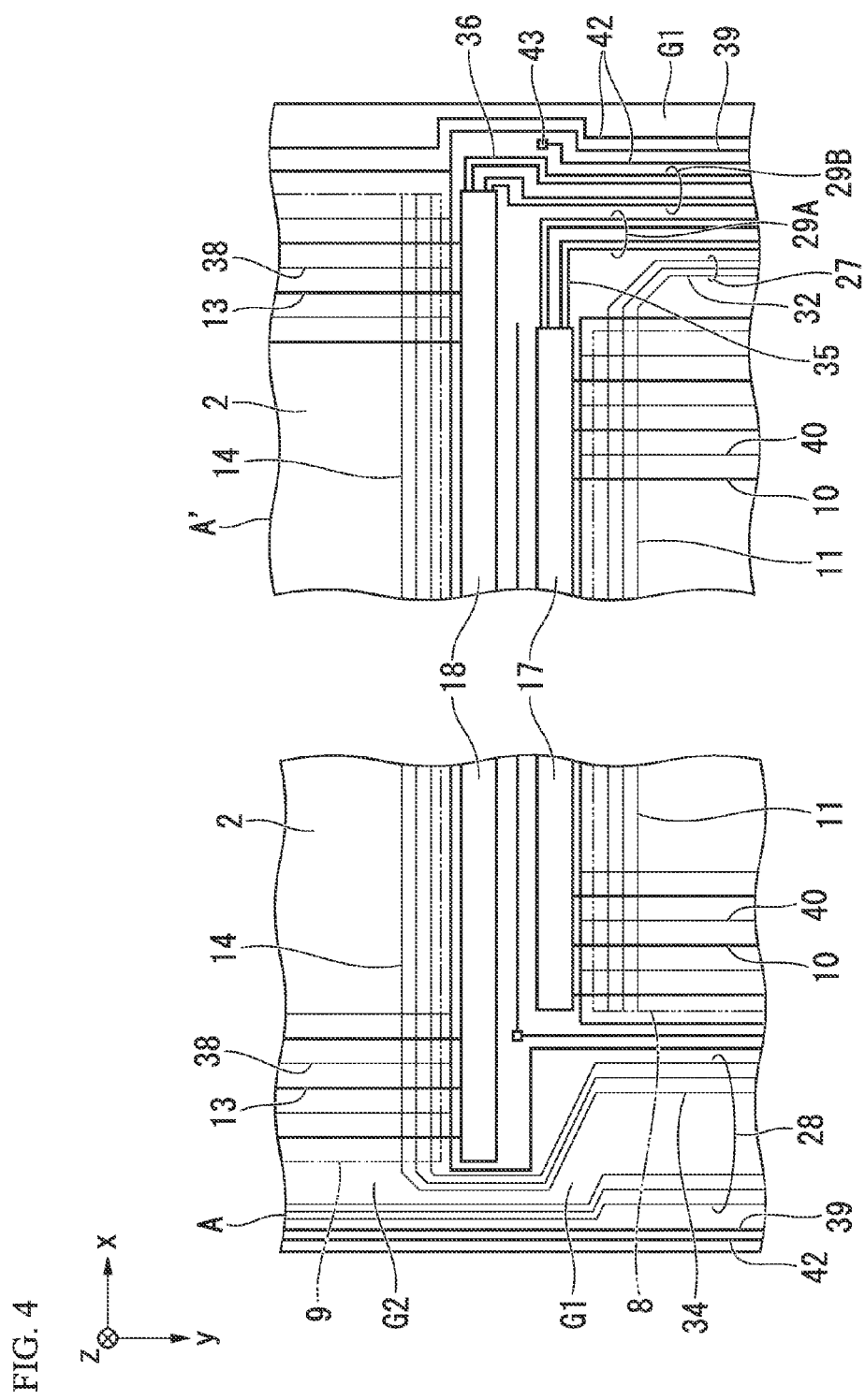
FIG. 4 is an enlarged plan view of the parts A and A' in FIG. 3.
Figure 5:
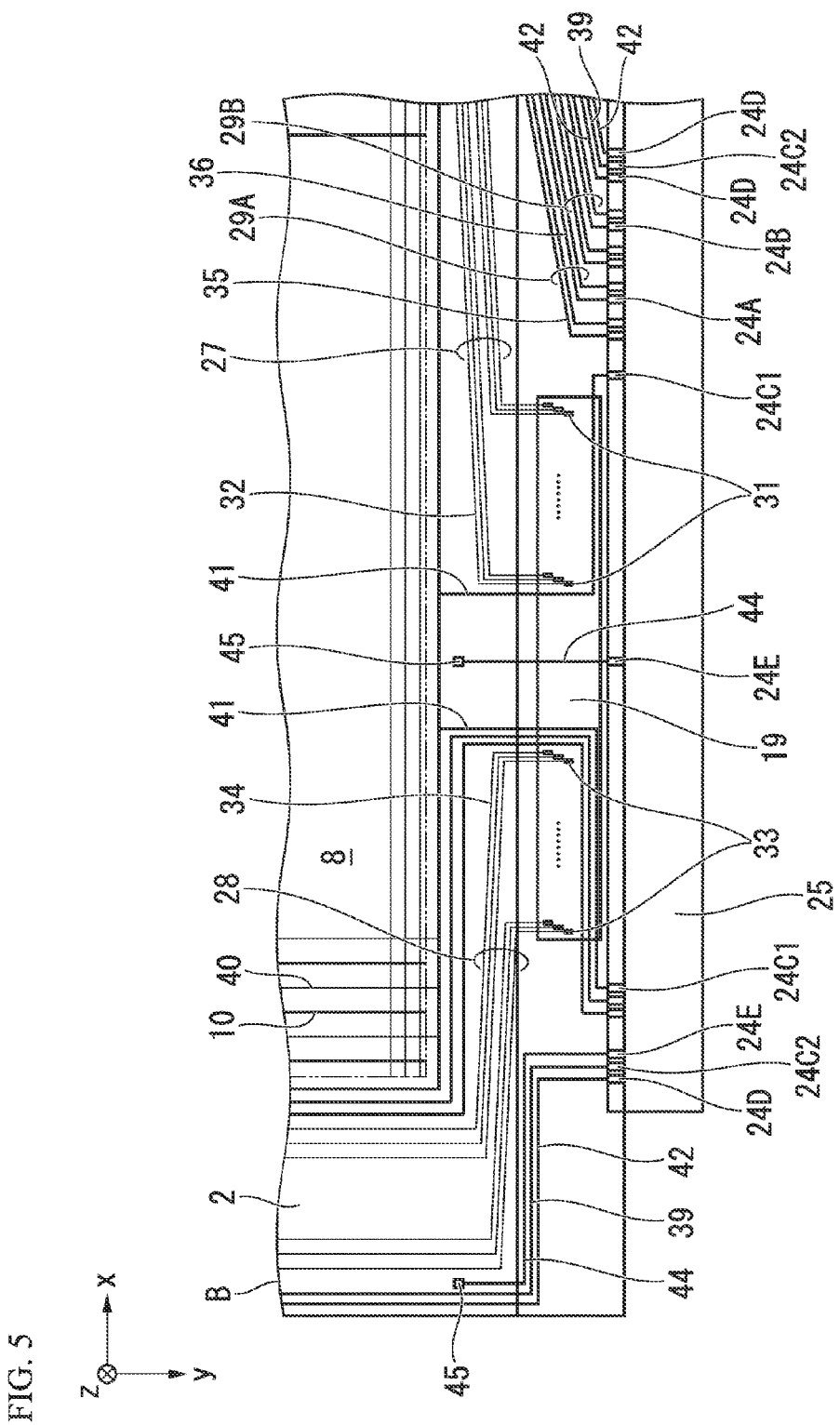
FIG. 5 is an enlarged plan view of the part B in FIG. 3.

FIG. 1 is a plan view of a liquid crystal display device of the present embodiment. FIG. 2 is a cross-sectional view along the line A-A' in FIG. 1. FIG. 3 is a plan view showing the circuit constitution in the peripheral edge part of the liquid crystal display device. FIG. 4 is an enlarged plan view of the parts A and A' in FIG. 3. FIG. 5 is an enlarged plan view of the part B in FIG. 3.

In order to make the various constituent elements in each of the drawings described below easier to see, the dimensional scale of some of the constituent elements will be changed.

As shown in FIG. 1 and FIG. 2, a liquid crystal display device 1 of the present embodiment has a liquid crystal panel 6 that includes an array substrate 2, an opposing substrate 3, sealing materials 4A and 4B adhering the array substrate 2 and the opposing substrate 3 to each other with a prescribed spacing therebetween, and a liquid crystal layer 5 sealed into a space surrounded by the array substrate 2, the opposing substrate 3, and the sealing materials 4A and 4B. In addition to the liquid crystal panel 6, if it is a transmission type, the liquid crystal display device 1 has a backlight, a pair of polarizing sheets, and the like. However, because these are of well-known construction, the descriptions and illustrations thereof will be omitted. The liquid crystal layer of the present embodiment corresponds to a display medium as recited in the claims.

The liquid crystal display device 1 has a constitution in which a first display part 8 and a second display part 9 are arranged along one direction (the y-axis direction in FIG. 1). In the case of the present embodiment, the sealing material is made of the first sealing material 4A surrounding the outer periphery of the first display part 8 and the second sealing material 4B surrounding outer periphery of the second display part 9. As the liquid crystal display device 1 of the present embodiment, for example, a liquid crystal display device of the vertical electric field type such a vertical alignment mode (VA mode) is envisioned. The first display part 8 and the second display part 9 are able to display separately. The liquid crystal display device 1 is preferably, for example, used for a game machine or a mobile electric device as a so-called double-display liquid crystal display device.

As shown in FIG. 1, the first display part 8 has a plurality of first gate lines 10 and a plurality of first data lines 11. The plurality of first gate lines 10 extend in the arrangement direction (y-axis direction in FIG. 1) of the first display part 8 and the second display part 9. The plurality of first data lines 11 extend in a direction perpendicular to the direction of arrangement of the first display part 8 and the second display part 9 (the x-axis direction in FIG. 1). Each region surrounded by neighboring first gate lines 10 and neighboring first data lines 11 has a first pixel electrode 12. The first display part 8 has a plurality of first pixel electrodes 12 in a matrix arrangement. First thin film transistors 7 (hereinafter abbreviated TFT, not shown) for the purpose of pixel switching are provided in the vicinity of points of intersection between the first gate lines 10 and the first data lines 11. The first TFT 7 is connected to the first gate line 10 and to the first data line 11. The first pixel electrode 12 is connected to the first TFT 7, so that it is connected to the first gate line 10 and the first data line 11 via the first TFT 7. In addition to the direct connection of the first pixel electrode 12 to the first TFT 7, there are cases in which the first pixel electrode 12 is connected to a different TFT from the first TFT 7 or connected indirectly to the first TFT 7 via a capacitive element.

The second display part 9 has a plurality of second gate lines 13 and a plurality of second data lines 14. The plurality of second gate lines 13 extend in the arrangement direction (the y-axis direction in FIG. 1) of the first display part 8 and the second display part 9. The plurality of second data lines 14 extend in a direction perpendicular to the direction of arrangement of the first display part 8 and the second display part 9 (x-axis direction in FIG. 1). Each region surrounded by neighboring second gate lines 13 and neighboring second data lines 14 has a second pixel electrode 15. The second display part 9 has a plurality of second pixel electrodes 15 arranged in a matrix. Second TFTs 16 for the purpose of pixel switching are provided in the vicinity of points of intersection between the second gate lines 13 and the second data lines 14. The second TFTs 16 are connected to the second gate lines 13 and the second data lines 14. The second pixel electrodes 15 are connected to the second TFTs 16 and are therefore connected to the second gate lines 13 and the second data lines 14 via the second TFTs 16. In addition to the direct connection of the second pixel electrode 15 to the second TFT 16, there are cases in which the second pixel electrode 15 is connected to a different TFT from the second TFT 16 or connected indirectly to the second TFT 16 via a capacitive element.

A first gate driver 17 is formed in the region sandwiched between the first display part 8 and the second display part 9 and has a function of supplying a gate signal to the plurality of first gate lines 10 of the first display part 8. The x-axis dimension of the first gate driver 17 is substantially equal to that of the first display part 8.

A part of the second gate driver 18 is formed in the region sandwiched between the first display part 8 and the second display part 9. The second gate driver 18 has a function supplying a gate signal to the plurality of second gate lines 13. The x-axis dimension of the second gate driver 18 is substantially equal to that of the second display part 9. As described later, the x-axis dimension of the first display part 8 is smaller than that of the second display part 9. Therefore, the center part of the second gate driver 18 is formed in the region sandwiched between the first display part 8 and the second display part 9. The edge part of the second gate driver 18 extends beyond the left and right regions sandwiched between the first display part 8 and the second display part 9.

Each of the first gate driver 17 and the second gate driver 18 includes TFTs (not shown) monolithically formed on one surface of the array substrate 2. More specifically, each of the first gate driver 17 and the second gate driver 18 includes a multi-staged shift register (not shown), and the shift register includes TFTs monolithically formed on one surface of the array substrate 2.

As shown in FIG. 1, the first sealing material 4A and second sealing material 4B, and the first gate driver 17 and second gate driver 18 are disposed in positions that do not overlap in a planar manner when viewed from normal line direction of the opposing substrate 3. A part in which the first sealing material 4A and the second sealing material 4B extend in parallel is disposed in the region sandwiched between the first gate driver 17 and the second gate driver 18.

The shape of the array substrate 2 and the opposing substrate 3 are both rectangles. The length of one side of the array substrate 2 (the side extending in the y-axis direction) is longer than that of the corresponding one side of the opposing substrate 3. The lower edge of the array substrate 2 therefore extends beyond the lower edge of the opposing substrate 3. Of the array substrate 2, the part extending beyond the opposing substrate 3 will be called as an extending part 2h. The first display part 8 is disposed at the near side to the extending part 2h of the array substrate 2, and the second display part 9 is disposed at the distant side from the extending part 2h. A data driver 19 is mounted on the extending part 2h of the array substrate 2 and has a function of supplying a video signal to the first data lines 11 and the second data lines 14. The data driver 19 is mounted on the array substrate 2 in the form of an IC chip.

The surfaces of the sides of the array substrate 2 and the opposing substrate 3, which are in contact with the liquid crystal layer 5, will be called inner surfaces, and the surfaces of the opposing sides of the array substrate 2 and the opposing substrate 3, which are in contact with the liquid crystal layer 5, will be called outer surfaces. As shown in FIG. 2, a plurality of first pixel electrodes 12 and a plurality of second pixel electrodes 15 are provided within the inner surface of the array substrate 2. The first pixel electrode 12 and the second pixel electrode 15 are constituted by a transparent conductive film such as an indium tin oxide (hereinafter abbreviated ITO).

In the center part of the inner surface of the array substrate 2, the first gate driver 17 and the second gate driver 18 are provided. In the inner surface of the opposing substrate 3, a light-blocking film 20 called a black matrix is provided, a first opposing electrode 21 is provided so as to oppose the plurality of first pixel electrodes 12, and a second opposing electrode 22 is provided so as to oppose the plurality of second pixel electrodes 15.

The region in which the plurality of first pixel electrodes 12 are arranged in a matrix substantially contributes to the display, this being taken to be the first display part 8. As the same manner, the region in which the plurality of second pixel electrodes 15 are arranged in a matrix substantially contributes to display, this being taken to be the second display part 9. The light-blocking film 20 is provided in a part other than the first display part 8 and the second display part 9. Stated differently, the parts of the light-blocking film 20 corresponding to the first display part 8 and the second display part 9 are opened. In FIG. 1, a part positioning the light-blocking film 20 is shown by a fine dot pattern.

The light-blocking film 20 overlaps the first gate driver 17 and the second gate driver 18 in a planar manner. This constitution blocks the intrusion of external light with respect to the TFTs of the shift register of the first gate driver 17 and the second gate driver 18. As a result, the shifting of the TFT characteristics is suppressed, enabling a reduction of the off-state leakage current. The above-noted constitution is particularly suitable for use in a bottom-gate TFT using an oxide semiconductor (InGaZnO) made of amorphous silicon, or of indium (In), gallium (Ga) and zinc (Zn) as the TFT channel layer.

Additionally, the light-blocking film 20 is provided in a matrix arrangement in a region overlapping the first gate lines 10, the first data lines 11, and the first TFTs of the first display part 8. In the same manner, the light-blocking film 20 is provided in a matrix arrangement in a region overlapping the second gate lines 13, the second data lines 14, and the second TFTs of the second display part 9. In FIG. 1, to make the drawing easy to grasp, the illustrations of the matrix light-blocking films within the display parts 8 and 9 are omitted.

FIG. 3 is a drawing omitting the light-blocking film 20 from constituent elements of FIG. 1 and showing a drive circuit and interconnect group of the peripheral part of the array substrate 2 being hidden beneath the light-blocking film 20. Although in FIG. 1 a part is omitted, as shown in FIG. 3, a plurality of external connection terminals 24 are provided in the extending part 2h of the array substrate 2. A flexible printed circuit board 25 (hereinafter abbreviated FPC) is connected to the plurality of external connection terminals 24. For example, an electronic component (not shown) such as a controller IC is mounted on the FPC 25, and various signals are output from the controller IC.

As one example of the number of the gate lines and data lines, the first display part 8 has 320 first gate lines 10 and 720 first data lines 11. Three dots of red (R), green (G) and blue (B) constitute one pixel, and a first data line 11 is provided for each dot. The number of pixels of the first display part 8 is therefore 320×240. The second display part 9 has 400 second gate lines 13 and 720 second data lines 14. The number of pixels of the second display part 9 is therefore 400×240.

The distance between neighboring first data lines 11 and the distance between neighboring second data lines 14 are the same. The distance between neighboring first gate lines 10 and the distance between neighboring second gate lines 13 are the same. That is, the pixel size of the first display part 8 and the pixel size of the second display part 9 are the same.

The array substrate 2 has a first data lead group (the interconnect group surrounded by the broken line with the reference numeral 27 in FIG. 3), a second data lead group (the interconnect group surrounded by the broken line with the reference numeral 28 in FIG. 3), and a first gate driver signal line group and a second gate driver signal line group (the overall interconnect group surrounded by the broken line with the reference numeral 29 in FIG. 3). The array substrate 2 has the above four types of interconnect groups.

As shown in FIG. 4, the first data lead group 27 is constituted by a plurality of first data leads 32 connecting the first data lines 11 and first data line terminals 31 (refer to FIG. 5). The second data lead group 28 is constituted by a plurality of second data leads 34 connecting the second data lines 14 and second data line terminals 33 (refer to FIG. 5). The first gate driver signal line group 29A is constituted by a plurality of first gate driver signal lines 35 connecting the first gate drivers 17 and external connection terminals 24A (refer to FIG. 5). The second gate driver signal line group 29B is constituted by a plurality of second gate driver signal lines 36 connecting the second gate drivers 18 and external connection terminals 24B (refer to FIG. 5).

As shown in FIG. 3, accompanying the above-described differences in the number of pixels (number of gate lines), the x-axis dimension of the first display part 8 is smaller than that of the second display part 9. The width W1 of the frame region G1 at the right and left of the first display part 8 (the x-axis dimension) is therefore wider than the width W2 of a frame region G2 at the right and left of the second display part 9 (the x-axis dimension). For this reason, first display part 8 is disposed at the lower side, that is, at the near side to the data driver 19 and the FPC 25, and the above-noted four types of interconnect groups are disposed in the frame region G1 at the right and left of the first display part 8. The reason for this arrangement will be described later.

Describing this in detail again, as shown in FIG. 4, the plurality of second data leads 34 lead out from the left side of the second display part 9 and are disposed in the frame regions G1 and G2 at the left side (first side) of the two sides opposing to the x-axis direction of the array substrate 2. The plurality of first data leads 32 lead out from the right side of the first display part 8, and are disposed in the frame region G1 at the right side (second side) of the two sides opposing to the x-axis direction of the array substrate 2. The plurality of first gate driver signal lines 35 lead out from the right side of the first gate driver 17, and are disposed in the frame region G1 of the right side. The plurality of second gate driver signal lines 36 lead out from the right side of the second gate driver 18, and are disposed in the frame region G1 at the right side. That is, the plurality of second data lead lines 34 are disposed in the frame regions G1 and G2 at the left side, and the plurality of first data lead lines 32, the plurality of first gate driver signal lines 35, and the plurality of second gate driver signal lines 36 are disposed in the frame region G1 at the right side.

The first gate driver signal lines 35 and the second gate driver signal lines 36 include, for example, a clock interconnect, a start pulse interconnect, a low-potential interconnect, an initialization interconnect, and the like. The low-potential interconnect supplies a low-level signal to each gate line. The initialization interconnect periodically supplies an initialization potential to a specific electrode within the gate driver.

Additionally, as shown in FIG. 4, the second display part 9 has a second Cs line 38 between two neighboring second gate lines 13. The second Cs line 38 is an interconnect for forming a holding capacitance (storage capacitance) within each pixel in the second display part 9. A second Cs lead 39 is provided in the frame regions G1 and G2 at the left side and at the right side of the array substrate 2. The upper edge of the second Cs lead 39 is connected to the second Cs line 38. As shown in FIG. 5, the bottom edge of the second Cs lead 39 is connected to external connection terminal 24C2.

In the same manner, the first display part 8 has a first Cs line 40 between two neighboring first gate lines 10. The first Cs line 40 is an interconnect for forming a holding capacitance (storage capacitance) within each pixel in the first display part 8. As shown in FIG. 5, a first Cs lead 41 is provided in the frame region of the bottom side of the array substrate 2. The upper edge of the first Cs lead 41 is connected to the first Cs line 40, and the bottom edge thereof is connected to the external connection terminal 24C1. In the case of the liquid crystal display device of a lateral electric field type, there may be a case in which constituent elements corresponding to a Cs line and Cs lead do not exist. When the holding capacitance (storage capacitance) is formed by using a transparent electrode (ITO or the like) formed on substantially the entire surface of the display part, there may be a case in which a constituent element corresponding to a Cs line does not exist. In this case, the above-noted transparent electrode is electrically connected to the Cs lead at the periphery of the display part.

As shown in FIG. 4, second common leads 42 are provided in the frame regions G1 and G2 at the left side and at the right side of the array substrate 2. The second common leads 42 are connected to the second opposing electrode 22 via a second common bridge 43 (Refer to FIG. 2). The second common bridge 43 is a material for electrically connecting the second common lead 42 of the array substrate 2 side and the second opposing electrode 22 of the opposing substrate 3 side. Second common bridges 43 are provided at a plurality of positions on the second opposing electrode 22. Specific elements of the second common bridges 43 are electrically conductive particles, such as gold particles or silver particles that are mixed into sealing materials, or carbon pastes or the like. As shown in FIG. 5, each of the plurality of second common leads 42 is connected to an external connection terminal 24D.

As shown in FIG. 5, first common leads 44 are provided in the frame region at the lower side of the array substrate 2. The first common leads 44 are connected to the first opposing electrode 21 via a first common bridge 45 (refer to FIG. 2). The first common bridge 45 is a material for electrically connecting the first common lead 44 of the array substrate 2 side and the first opposing electrode 21 of the opposing substrate 3 side. Specific elements of the first common bridge 45 are the same as that of the second common bridge 43. The bottom edges of the first common leads 44 are connected to external connection terminals 24E.

As shown in FIG. 5, the first data line terminals 31 for connecting the first data leads 32 to the data driver 19 are provided at the right side of the region corresponding to the data driver 19 on the array substrate 2. The second data line terminals 33 for connecting the second data leads 34 to the data driver 19 are provided at the left side of the region corresponding to the data driver 19 on the array substrate 2. Of the region for forming a plurality of external connection terminals 24, in the righthand region, the external connection terminals 24A for the plurality of first gate driver signal lines 35 and the external connection terminals 24B for the plurality of second gate driver signal lines 36 are provided.

As described above, in the present embodiment the first gate driver 17 and the second gate driver 18 are formed in the region sandwiched between the first display part 8 and the second display part 9. That is, the first gate driver 17 and the second gate driver 18 are disposed at substantially the center of the array substrate 2 rather than at the peripheral edge part of the array substrate 2. For this reason, it is difficult for water to intrude into the first gate driver 17 and the second gate driver 18, and also difficult for a decrease in the reliability of the gate driver accompanying corrosion of interconnects and deterioration in the performance of elements forming the driver circuit to occur.

Additionally, the first gate driver 17 and the second gate driver 18 are not disposed directly below the first sealing material 4A and the second sealing material 4B. For this reason, even if the frame of the liquid crystal display device 1 is narrowed, it is possible to avoid stress from the first sealing material 4A and the second sealing material 4B being applied to the TFTs of the first gate driver 17 and the second gate driver 18. As a result, breakage of the TFTs is suppressed, and it is possible to obtain a gate driver having superior reliability.

Additionally, even if a light-cured sealing material, such as a UV-cured sealing material, is used as the first sealing material 4A and the second sealing material 4B, the patterns by the first gate driver 17 and the second gate driver 18 do not block the light. In the process for manufacturing the liquid crystal display device 1, it is therefore possible to cure the sealing material with better certainty.

As the present embodiment, in narrowing the frame in the liquid crystal display device 1, it is preferable that the first display part 8 having a small size of the right and left directions (x-axis direction) is disposed at the near side to the extending part 2h of the array substrate 2, that is, at the near side to the region in which the data driver 19 and the FPC 25 are mounted, the reason for this being as follows.

Of the array substrate 2, various interconnects are arranged in a concentrated manner in the region close to the data driver 19 and the FPC 25. In the case of the present embodiment, for example, because the first gate driver 17 and the second gate driver 18 are disposed at substantially the center of the array substrate 2, regions for arranging many first gate driver signal lines 35 and second gate driver signal lines 36 are required. In this case, if the x-axis direction of the of the first display part 8, which is near to the region for mounting the data driver 19 and the FPC 25, is small, a margin is generated at the left and at the right of the first display part 8. The first gate driver signal lines 35 and the second gate driver signal lines 36 may be disposed in these margins. If the second display part 9 having a large size is disposed at the side near to the region in which the data driver 18 and the FPC 25 are mounted, it is necessary to add the region for disposing the first gate driver signal lines 35 and the second gate driver signal lines 36 at the left and at the right of the second display part 9, in which case it is difficult to narrow the frame.

In the case of the present embodiment, although the second data leads 34 of the second display part 9 at a position distant from the data driver 19 are disposed in the frame region at the left side, the remaining first data leads 32, the first gate driver signal lines 35, and the second gate driver signal lines 36 are not disposed in the frame region at the left side. The reason for adopting this arrangement is that, to the extent that the second data lead 34 is longer than the first data lead 32, the signal tends to be delayed or dulled, and the lead tends to experience opens. For this reason, it is preferable to reserve the region for making the second data lead 34 thick compared with the other interconnects. In the present embodiment, the width of the second data lead 34 on side of the second display part 9 differs from that on side of the first display part 8. The width of the second data lead 34 is, for example, 4 µm on the side of the second display part 9 and, for example, 6 µm on the side of the first display part 8. In the present embodiment, the first data lead 32 and the second data lead 34 are formed as mutually neighboring leads in different layers, thereby enabling the interconnect pitch to be widened in a given layer.

In the case of the present embodiment, some of the first common leads 44 are disposed in the region sandwiched between the first data line terminals 31 and the second data line terminals 33 of the data driver 19. For this reason, a first common lead 44 connects the external connection terminal 24E and the first common bridge 45 in the shortest distance. As a result, it is possible to reduce the delay and dulling of the common signal supplied to the first opposing electrode 21, and to reduce the number of the first common bridges 45.

(Second Embodiment)

The second embodiment of the present invention will be described, with reference made to FIG. 6.

The basic constitution of the liquid crystal display device of the present embodiment is the same as in the first embodiment, and the constitution of the sealing material differs from that in the first embodiment.

Figure 6:
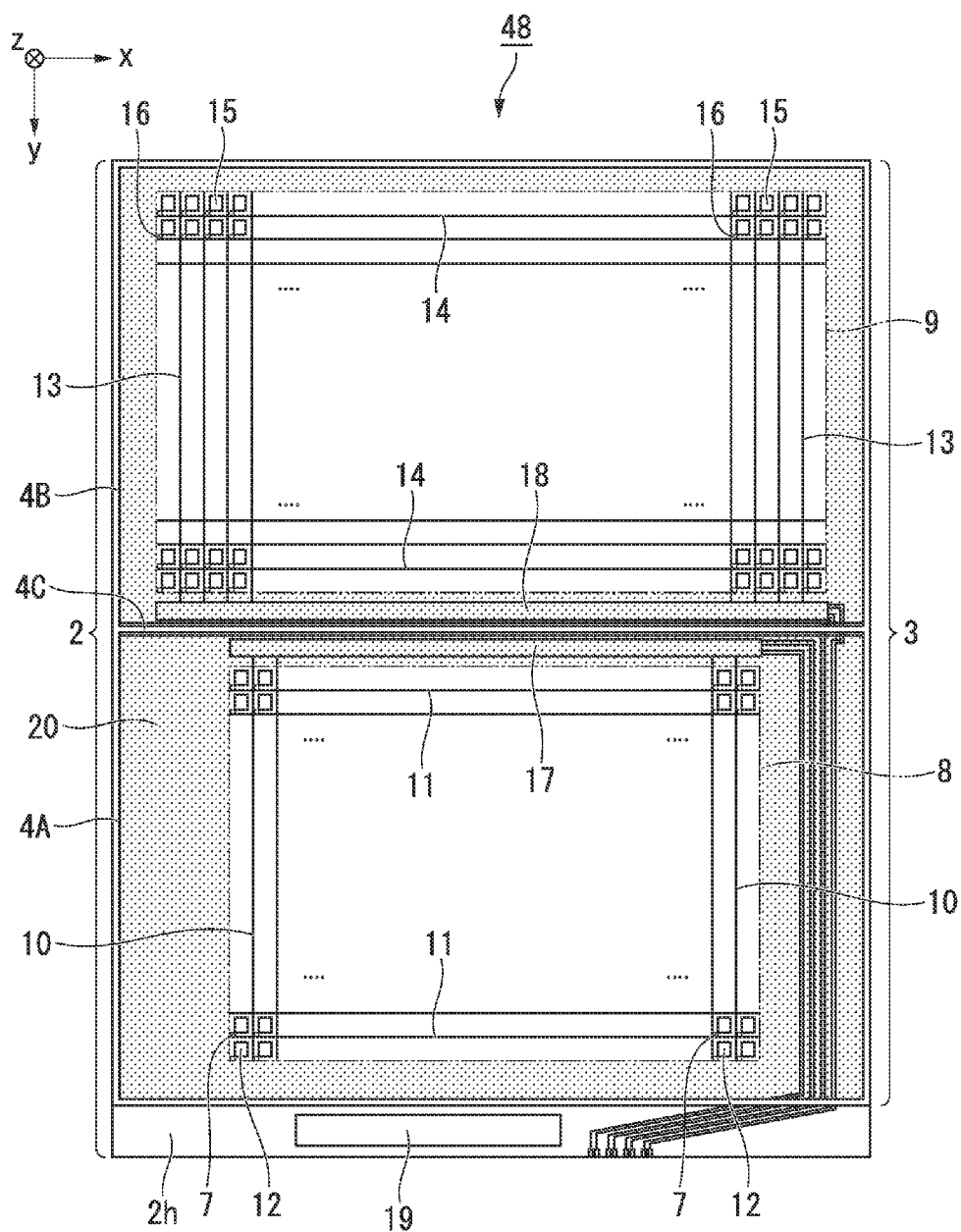
FIG. 6 is a plan view of a liquid crystal display device according to a second embodiment.

FIG. 6 is a plan view of a liquid crystal display device of the present embodiment.

In FIG. 6, constituent elements that are in common with those in FIG. 1 of the first embodiment are assigned the same reference symbols, and the detailed description thereof will be omitted.

In the case of the first embodiment, the sealing material is made of the first sealing material 4A surrounding the outer periphery of the first display part 8 and the second sealing material 4B surrounding the outer periphery of the second display part 9. In contrast, as shown in FIG. 6, in a liquid crystal display device 48 of the present embodiment, one sealing material 4C is shared between a part of the side facing the second display part 9 of the first sealing material 4A and a part of the side facing the first display part 8 of the second sealing material 4B. The sealing material 4C of the shared part is arranged in a position not overlapping the first gate driver 17 and the second gate driver 18. All sealing materials 4A, 4B and 4C may be integrated. Other constituent elements are the same as in the first embodiment.

In the present embodiment as well, the same effect can be obtained as in the first embodiment, so that it is difficult for water to intrude into the gate drivers, and it is also possible to avoid stress from the sealing materials being applied to the TFTs of the gate drivers, thereby enabling the implementation of a liquid crystal display device including the gate driver having superior reliability.

In general, if a liquid crystal display device is oriented upright, the lower part thereof swells due to gravity, and there are cases in which abnormalities occur in the liquid crystal layer (cell) thickness. If it is desired to solve this problem, as in the first and second embodiments, it is preferable to divide a liquid crystal layer 5 by forming a sealing material in the boundary between the first display device 8 and the second display device 9.

(Third Embodiment)

The third embodiment of the present invention will be described, with reference made to FIG. 7.

The basic constitution of the liquid crystal display device of the present embodiment is the same as in the first embodiment, and the constitution of the sealing material differs from that in the first embodiment.

Figure 7:
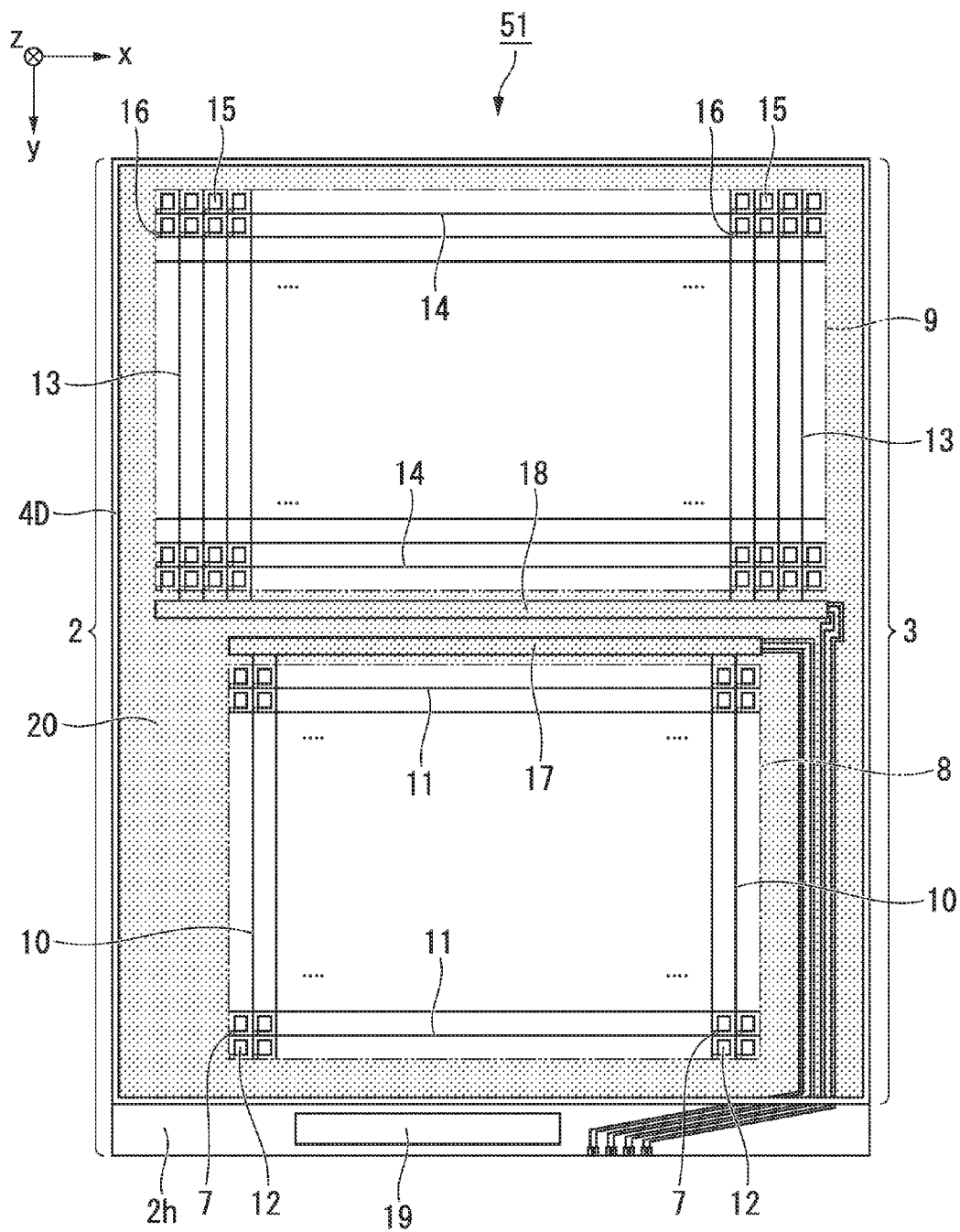
FIG. 7 is a plan view of a liquid crystal display device according to a third embodiment.

FIG. 7 is a plan view of a liquid crystal display device of the present embodiment.

In FIG. 7, constituent elements that are in common with those in FIG. 1 of the first embodiment are assigned the same reference symbols, and the detailed description thereof will be omitted.

As shown in FIG. 7, a liquid crystal display device 51 of the present embodiment has a sealing material 4D integrally surrounding the outer periphery of the first display part 8 and the second display part 9. The liquid crystal layer 5 is not thus divided by the first display part 8 and the second display part 9 (refer to FIG. 2). In the case of the present embodiment, because the sealing material 4D is not disposed in the central part of the liquid crystal display device 51, it does not overlap with the first gate driver 17 and the second gate driver 18. Other constituent elements are the same as in the first embodiment.

In the present embodiment as well, the same effect can be obtained as in the first embodiment, so that it is difficult for water to intrude into the gate drivers, and it is also possible to avoid stress from the sealing materials being applied to the TFTs of the gate drivers, thereby enabling the implementation of a liquid crystal display device including the gate driver having superior reliability.

When a sealing material is coated using a dispenser or the like in the process for forming the sealing material, from the standpoint of shortening the manufacturing process, it is preferable in the present embodiment to make the pattern of the sealing material simple as possible. The patterns of the sealing materials of the first to third embodiments may be selected discretionally according to the size of a liquid crystal panel, the method for forming the sealing material, the method for injecting a liquid crystal, and other factors. Method that can be used for forming the sealing material include a screen-printing method, a method for coating using a dispenser, as well as other methods. Methods that can be used to injecting the liquid crystal include the method of dropping liquid crystal, the method of vacuum injection from an injection port, as well as other methods.

(Fourth Embodiment)

The fourth embodiment of the present invention will be described, with references made to FIG. 8 and FIG. 9.

The basic constitution of the liquid crystal display device of the present embodiment is the same as in the first embodiment, and the shape of both substrates and the disposition of the data driver and FPC differ from that in the first embodiment.

Figure 8:
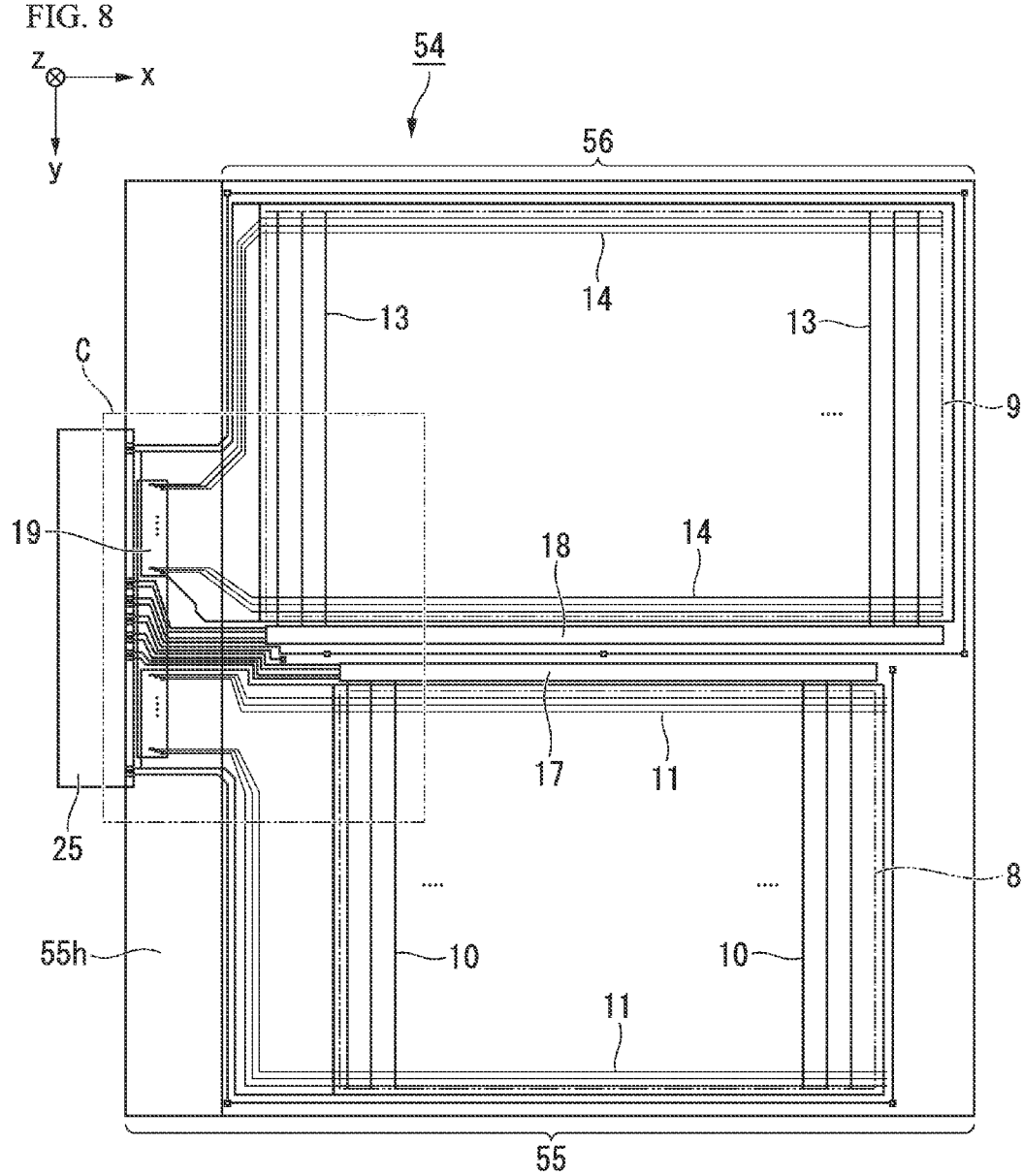
FIG. 8 is a plan view of a liquid crystal display device according to a fourth embodiment.

FIG. 8 is a plan view of a liquid crystal display device according to the present embodiment. FIG. 9 is an enlarged view of part C in FIG. 8.

Figure 9:
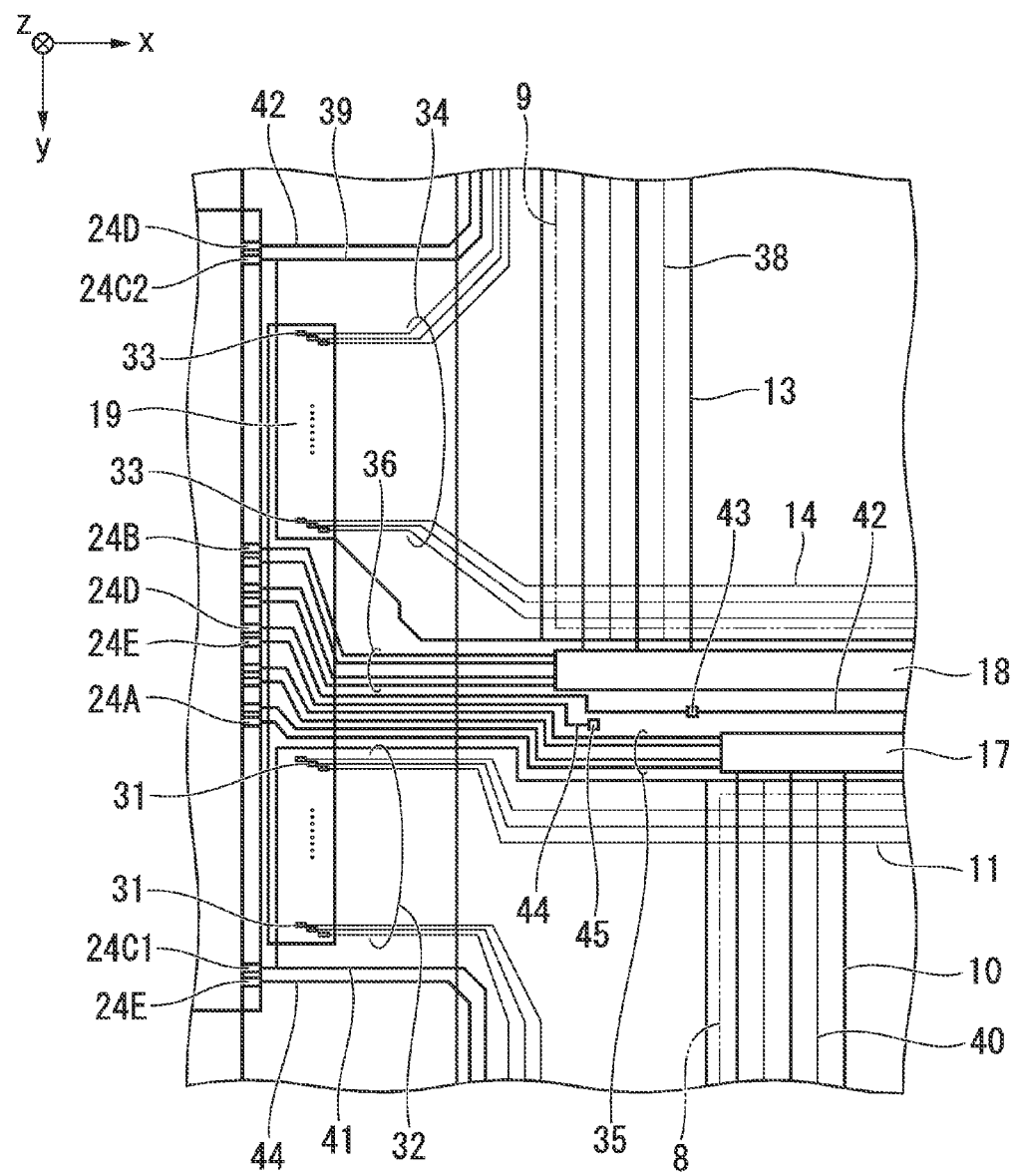
FIG. 9 is an enlarged view of the part C in FIG. 8.

In FIG. 8 and FIG. 9, constituent elements that are in common with those in FIG. 3 of the first embodiment are assigned the same reference symbols, and the detailed description thereof will be omitted.

As shown FIG. 8 in a liquid crystal display device 54 of the present embodiment, the shape of an array substrate 55 and an opposing substrate 56 are both rectangles. The length of one side of the array substrate 55 (the side extending in the x-axis direction) is longer than that of the corresponding side of the opposing substrate 56. The left edge of the array substrate 55 therefore extends beyond the left edge of the opposing substrate 56. The direction of arrangement of the first display part 8 and the second display part 9 is, however, the y-axis direction, which is the same as in the first embodiment. A data driver 19 and the FPC 25 are mounted on an extending part 55h at the left edge of the array substrate 55. This structure is preferable when it is desired to make the frame size in the upper and lower directions smaller than the frame size in the left and right directions.

As shown in FIG. 9, a plurality of first gate driver signal lines 35 lead from the left edge of the first gate driver 17, extend to the left side, and are connected to the terminals 24A for the first gate driver signal lines. In the same manner, a plurality of second gate driver signal lines 36 lead from the left edge of the second gate driver 18, extend to the left side, and are connected to the terminals 24B for the second gate driver signal lines. A part of the plurality of first gate driver signal lines 35 and a part of the plurality of second gate driver signal lines 36 are disposed in the region sandwiched between the plurality of first data line terminals 31 and the plurality of second data line terminals 33.

In the present embodiment as well, the same effect can be obtained as in the first embodiment, so that it is difficult for water to intrude into the gate drivers, and it is also possible to avoid stress from the sealing materials being applied to the TFTs of the gate drivers, thereby enabling the implementation of a liquid crystal display device including the gate driver having superior reliability.

Additionally, in the case of the present embodiment, because the distance between the first gate driver 17, the second gate driver 18, and the FPC 25 is short, the first gate driver signal line 35 and the second gate driver signal line 36 are connected by the shortest distance between each of the external connection terminals 24A, 24B and each of the gate drivers 17, 18. This structure enables a reduction of the delay and dulling of the gate signal.

(Fifth Embodiment)

The fifth embodiment of the present invention will be described, with references made to FIG. 10.

The basic constitution of the liquid crystal display device of the present embodiment is the same as in the first embodiment, and a part of gate driver signal lines differs from that in the first embodiment.

Figure 10:
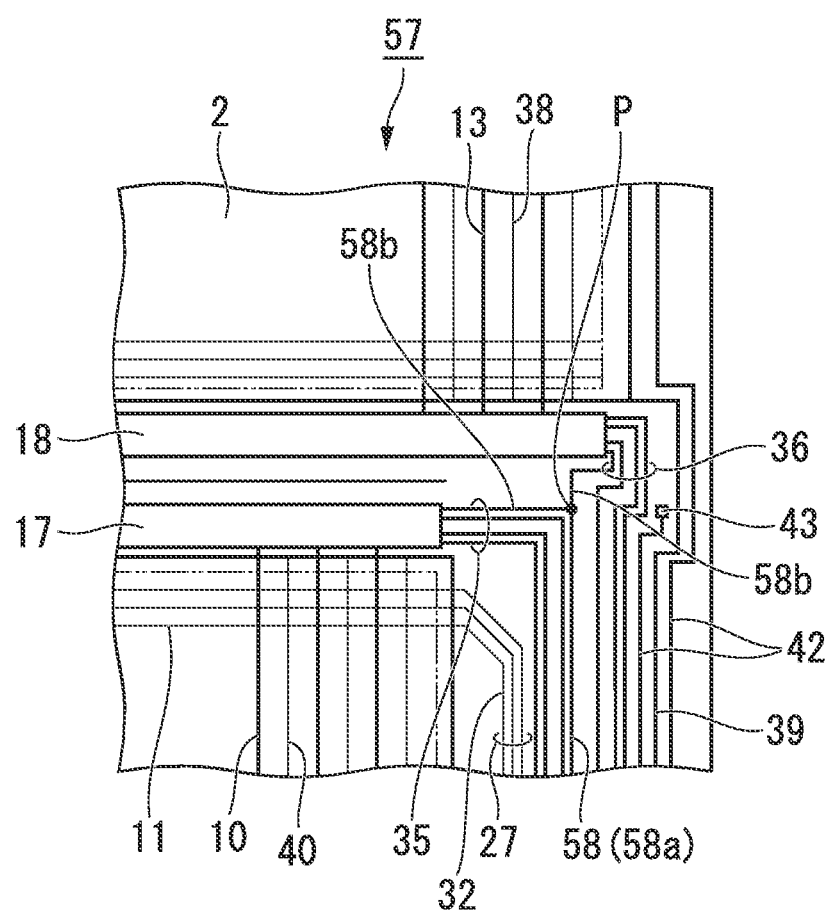
FIG. 10 is a plan view of the main parts of a liquid crystal display device of a fifth embodiment.

FIG. 10 is a plan view of the main parts of a liquid crystal display device of the present embodiment. FIG. 10 shows a part corresponding part A' of FIG. 4 used in the first embodiment.

In FIG. 10, constituent elements that are in common with those in FIG. 4 of the first embodiment are assigned the same reference symbols, and the detailed description thereof will be omitted.

As shown in FIG. 10, in a liquid crystal display device 57 of the present embodiment, of the first gate driver signal line 35 and the second gate driver signal line 36, a low-potential interconnect 58 is shared by the first gate driver 17 and the second gate driver 18, and has one main line 58a extending from the external connection terminal and branched branch lines 58b into which the main line 58a is branched into two at the branch point P immediately before the first gate driver 17 and the second gate driver 18. Each of the branch lines 58b is connected to the first gate driver 17 or to the second gate driver 18. The low-potential interconnect 58 is the interconnect for supplying a low-level signal to the gate line. That is, of the plurality of first gate driver signal lines 35 and the plurality of second gate driver signal lines 36, signal lines having the same function share the first gate driver 17 and the second gate driver 18. Other constituent elements are the same as in the first embodiment.

In the present embodiment as well, the same effect can be obtained as the first embodiment, so that it is difficult for water to intrude into the gate drivers, and it is also possible to avoid stress from the sealing materials being applied to the TFTs of the gate drivers, thereby enabling the implementation of a liquid crystal display device including the gate driver having superior reliability.

Additionally, because the total number of the gate driver signal lines can be reduced, it is possible to accomplish further frame narrowing of the liquid crystal display device 57. Because the number of FPC connection terminals can be reduced to the extent of the reduction of the overall number of gate driver signal lines, the width of the FPC 25 can be reduced. This enables a reduction of the size of the liquid crystal module including the FPC 25. Not only the low-potential interconnect 58, but also, for example, another interconnect, such as an initialization interconnect can be shared by the first gate driver 17 and the second gate driver 18. In order to implement this constitution, it is necessary to adjust the drive timing of the first display part 8 and the second display part 9.

(Sixth Embodiment)

The six embodiment of the present invention will be described, with references made to FIG. 11 and FIG. 12.

The basic constitution of the liquid crystal display device of the present embodiment is the same as in the first embodiment, and the constitution of the gate driver differs from that of the first embodiment.

Figure 11:
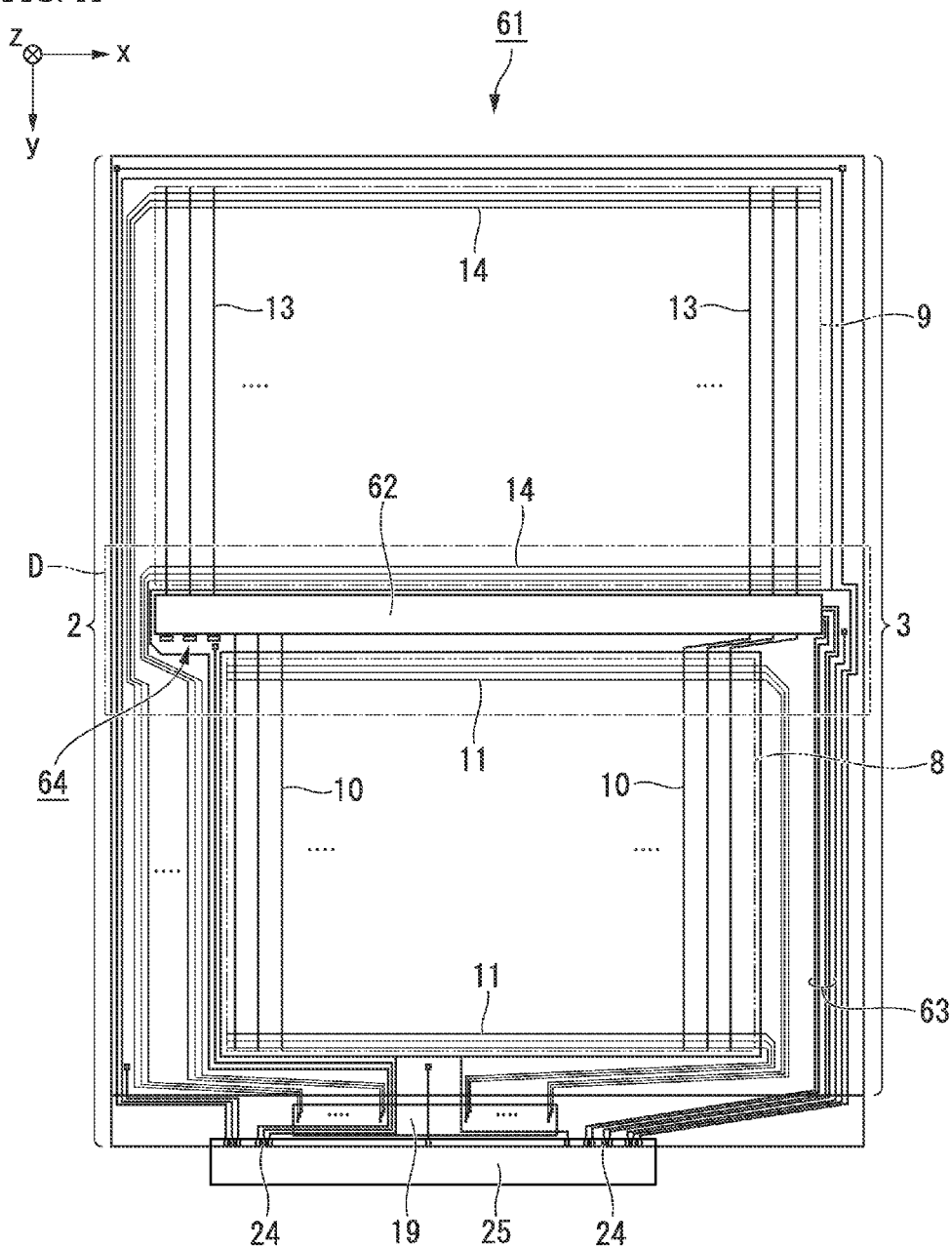
FIG. 11 is a plan view of a liquid crystal display device of a sixth embodiment.

FIG. 11 is a plan view of a liquid crystal display device of the present embodiment. FIG. 12 is an enlarged drawing of part D in FIG. 11.

Figure 12:
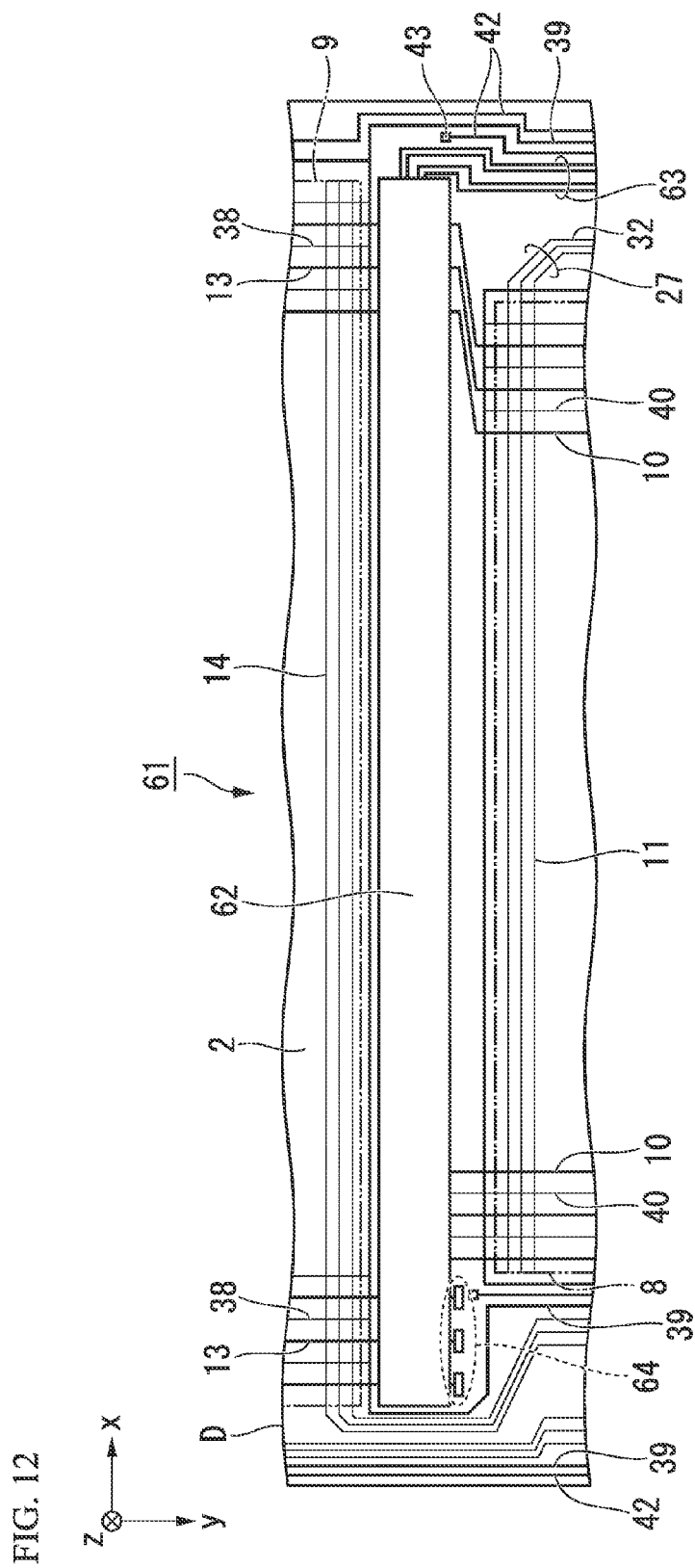
FIG. 12 is an enlarged view of the part D in FIG. 11.

In FIG. 11 and FIG. 12, constituent elements that are in common with those in FIG. 3 and FIG. 4 of the first embodiment are assigned the same reference symbols, and the detailed description thereof will be omitted.

The liquid crystal display device 1 of the first embodiment has separately the first gate driver 17 of the first display part and the second gate driver 18 of the second display part. However, as shown in FIG. 11, a liquid crystal display device 61 of the present embodiment has a gate driver 62 supplying a gate signal to the first gate lines 10 of the first display part 8 and to the second gate lines 13 of the second display part 9. That is, the first display part 8 and the second display part 9 share one gate driver 62. The gate driver 62 includes a multi-staged shift register (not shown), and the shift register includes TFTs (not shown) monolithically formed on the array substrate 2. A part of the gate driver 62 is formed in the region sandwiched between the first display part 8 and the second display part 9. In FIG. 11, although the sealing material is not illustrated, in the present embodiment as well, the sealing material and the gate driver 62 are disposed in the positions that do not overlap in a planar manner.

In the case of the present embodiment, because the first display part 8 and the second display part 9 share one gate driver 62, they also share the plurality of gate driver signal lines 63. The plurality of gate driver signal lines 63 lead from the right edge of the gate driver 62, are disposed along the right side of the array substrate 2, and are connected to the external connection terminals 24.

Inside the gate driver 62, the first display part 8 and the second display part 9 share an output TFT outputting a gate signal to each of the gate lines. In the present embodiment as well, similar to the first embodiment, the number of the second gate lines 13 of the second display part 9 is greater than that of the first gate lines 10 of the first display part 8. Output TFTs connected to both of the first gate lines 10 and the second gate lines 13 and output TFTs connected to only the second gate lines 13 exist within the plurality of the output TFTs. For example, if there are 320 first gate lines 10 and 400 second gate lines 13, of 400 output TFTs, 320 output TFTs are connected to both of the first gate lines 10 and the second gate lines 13, and 80 output TFTs are connected to the only second gate lines 13.

As shown in FIG. 12, load capacitance adjusters 64 are connected to each of the output TFTs (not shown) connected only to the second gate lines 13. The load capacitance adjusters 64 can be implemented by superimposing, for example, the second Cs leads 39 and drain electrodes of the output TFTs (electrodes of the side connected to the gate lines) via a gate insulating film. Generally, output TFTs connected to two gate lines and output TFTs connected to one gate line differ in load capacitances. If the load capacitances are different, the manner of occurrence of the delay and dulling of the gate signal are also different, and luminance differences may occur due to differences in the amounts of charge and of feed-through voltage to each pixel capacitance. Block-shaped luminance differences therefore occur in the second display part 9 at a pixel region corresponding to the second gate lines 13 sharing the first gate lines 10 and the output TFTs and at a pixel region corresponding to the second gate lines 13 not sharing the first gate lines 10 and the output TFTs. Regarding this problem, connection of the load capacitance adjusters 64 to the output TFTs connecting to one gate line can make both load capacitances substantially the same. As a result, the effect of suppressing the block-shaped luminance differences can be achieved.

If the number of the first gate lines 10 and the number of the second gate lines 13 are equal, there is no need for the load capacitance adjusters 64. Other constituent elements are the same as in the first embodiment.

In the present embodiment as well, the same effect can be obtained as the first embodiment, so that it is difficult for water to intrude into the gate drivers, and it is also possible to avoid stress from the sealing materials being applied to the TFTs of the gate drivers, thereby enabling the implementation of a liquid crystal display device including the gate driver having superior reliability.

In particular in the case of the present embodiment, because the first display part 8 and the second display part 9 share the gate driver signal line 63 the region to dispose the gate driver signal lines 63 can be narrower compared to that in the first embodiment. As a result, frame region both in the upper and lower directions and in the left and right directions can be narrowed. Additionally, because the number of external connection terminals 24 can be reduced to the extent of reduction of overall number of the gate driver signal lines 63, the width of the FPC 25 can be made narrow. This enables reduction of the size of the liquid crystal module including the FPC 25. In order to implement the constitution of the present embodiment, it is necessary to adjust the drive timing of the first display part 8 and the second display part 9.

(Seventh Embodiment)

The seventh embodiment of the present invention will be described, with references made to FIG. 13.

The basic constitution of the liquid crystal display device of the present embodiment is the same as in the sixth embodiment, and the constitution of the gate driver differs from that of the first embodiment.

Figure 13:
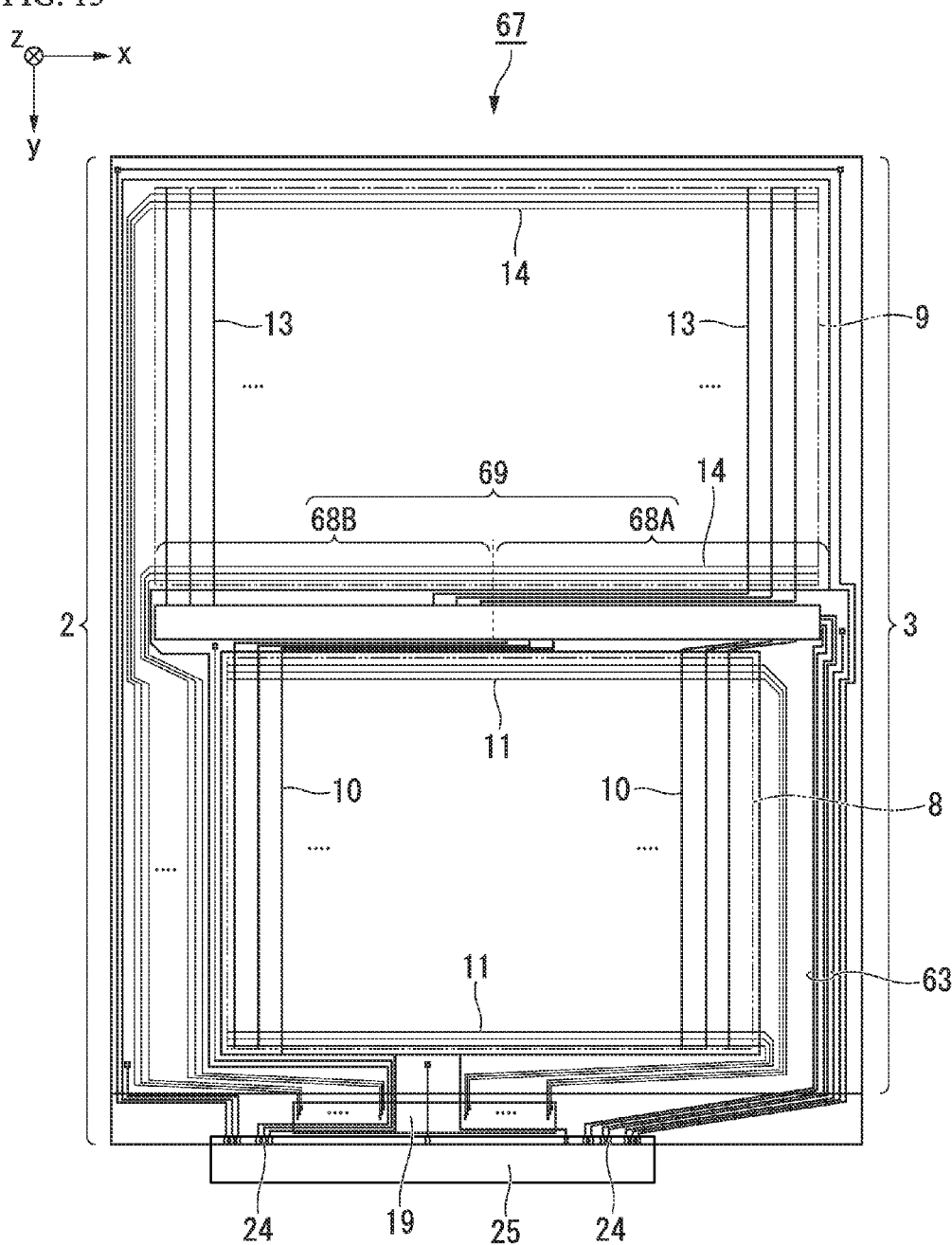
FIG. 13 is a plan view of a liquid crystal display device of a seventh embodiment.

FIG. 13 is a plan view of a liquid crystal display device of the present embodiment.

In FIG. 13, constituent elements that are in common with those in FIG. 11 of the sixth embodiment are assigned the same reference symbols, and the detailed description thereof will be omitted.

As shown in FIG. 13, a liquid crystal display device 67 of the present embodiment is same as in the sixth embodiment in that that the first display part 8 and the second display part 9 share one gate driver 69. It is however different from the sixth embodiment such that the output unit of the gate driver 69 is divided into a first gate line output unit 68A and the second gate line output unit 69B. Specifically, the right side part of the gate driver 69 is allocated to the first gate line output unit 68A and, the left side part of the gate driver 69 is allocated to the second gate line output unit 68B. For this reason, all of the first gate lines 10 lead from only the right side part of the gate driver 69, and all of the second gate lines 13 lead from only the left side part of the gate driver 69. The other constituent elements are the same as the sixth embodiment.

In the present embodiment as well, the same effect can be obtained as the first embodiment, so that it is difficult for water to intrude into the gate drivers, and it is also possible to avoid stress from the sealing materials being applied to the TFTs of the gate drivers, thereby enabling the implementation of a liquid crystal display device including the gate driver having superior reliability.

The present embodiment is particularly suitable for the case in which an oxide semiconductor (InGaZnO) made of indium (In), gallium (Ga) and zinc (Zn) is used as the output TFT within the gate driver 69 and as the TFT channel layer within the pixel region. The reason for this is that in a TFT using the oxide semiconductor InGaZnO, the on current is large, the off current is small, and it is possible to reduce the size of TFT.

The technical scope of the present invention is not restricted to that of the above-noted embodiments and can be subjected to various modification, within the scope of the spirit thereof.

In the above-noted embodiments, for example, although examples are cited in which the number of gate lines and the number of pixels are different in the first display part and the second display part, the present invention is not particularly restricted to this. For example, a constitution may be made in which, between the first display part and the second display part, the numbers of pixels are equal, the sizes of pixels are different, and the surface areas are different. Alternatively, a constitution may be made in which, between the first display part and the second display part, the numbers of gate lines are equal and the numbers of data lines are different. Alternatively, a constitution may be made in which, between the first display part and the second display part, both the numbers of gate lines and the numbers of data lines are different.

In the above-described embodiments examples are shown in which the data driver outputting a data signal to the first data line, and the data driver outputting a data signal to the second data line are constituted by one data driver. However, the data driver outputting a data signal to the first data line and the data driver outputting a data signal to the second data line may be separate data drivers. That is, a constitution may be made in which two data drivers are mounted on the array substrate. Additionally, a plurality of data drivers may be provided for one display unit. Additionally, the numbers, arrangements, and shapes of various circuits or interconnects are not restricted to the above embodiments, and may be changed as appropriate.

The display device of the present invention is not restricted to being a liquid crystal display device, and, for example, may be electronic paper using microcapsules in which white charged particles and black charged particles are sealed as the display medium. Alternatively, the display device of the present invention may be an organic electroluminescence display device, in which an organic light-emitting layer that emits light by charge injection is used as the display medium.

INDUSTRIAL APPLICABILITY

The present invention is usable in various display devises, such as liquid crystal display devices, electronic paper, and organic electroluminescence display devices.

DESCRIPTION OF REFERENCE SYMBOLS 1, 48, 51, 54, 57, 61, 67 Liquid display device
2 Array substrate
3 Opposing substrate
4A First sealing material
4B Second sealing material
4C, 4D Sealing material
5 Liquid crystal layer (display medium)
8 First display part
9 Second display part
10 First gate line
11 First data line
12 First pixel electrode
7 First TFT
13 Second gate line
14 Second data line
15 Second pixel electrode
16 Second TFT
17 First gate driver
18 Second gate driver
19 Data driver
20 Light-blocking film
21 First opposing electrode
22 Second opposing electrode
32 First data lead
34 Second data lead
35 First gate driver signal line
36 Second gate driver signal line
44 First common lead
58 Low-potential interconnect
62, 69 Gate driver
63 Gate driver signal line
64 Load capacitance adjuster
68A First gate line output unit
68B Second gate line output unit

The invention claimed is:

1. A display device comprising:
an array substrate in which a first display part and a second display part are disposed side by side on one surface;
an opposing substrate;
a sealing material adhering the array substrate and the opposing substrate with a prescribed spacing; and
a display medium sealed within a space surrounded by the array substrate, the opposing substrate, and the sealing material,
wherein the first display part comprises a plurality of first gate lines that extend in an arrangement direction of the first display part and second display part, a plurality of first data lines that extend in a direction perpendicular to the arrangement direction, a first thin film transistor that is connected to the first gate lines and the first data lines, and a first pixel electrode that is directly or indirectly connected to the first thin film transistor,
wherein the second display part comprises a plurality of second gate lines that extend in an arrangement direction of the first display part and the second display part, a plurality of second data lines that extend in a direction perpendicular to the arrangement direction, a second thin film transistor that is connected to the second gate lines and the second data lines, and a second pixel electrode that is directly or indirectly connected to the second thin film transistor,
wherein each of a first gate driver supplying a gate signal to the first gate lines and a second gate driver supplying a gate signal to the second gate lines are constituted to comprise a transistor formed on one surface of the array substrate,
wherein at least a part of the first gate driver and at least a part of the second gate driver are formed in a region sandwiched between the first display part and the second display part,
wherein the number of the first gate lines is smaller than the number of the second gate lines,
wherein a data driver supplying a data signal to the first data lines and the second data lines is disposed on one side at a near side to the first display part of two sides opposing to the arrangement direction of the array substrate with a rectangular-shape,
wherein the array substrate further comprises first data leads connecting the first data lines and first data line terminals, second data leads connecting the second data lines and second data line terminals, first gate driver signal lines connecting the first gate driver and an external connection terminal, and second gate driver signal lines connecting the second gate driver and an external connection terminal, wherein the second data leads are disposed in a first side of two sides opposing to a direction perpendicular to the arrangement direction of the array substrate, and wherein the first data leads, the first gate driver signal lines and the second gate driver signal lines are disposed in a second side of the two sides.

2. A display device comprising:

an array substrate in which a first display part and a second display part are disposed side by side on one surface;

an opposing substrate;

a sealing material adhering the array substrate and the opposing substrate with a prescribed spacing; and a display medium sealed within a space surrounded by the array substrate, the opposing substrate, and the sealing material, wherein the first display part comprises a plurality of first gate lines that extend in an arrangement direction of the first display part and the second display part, a plurality of first data lines that extend in a direction perpendicular to the arrangement direction, a first thin film transistor that is connected to the first gate lines and the first data lines, and a first pixel electrode that is directly or indirectly connected to the first thin film transistor, wherein the second display part comprises a plurality of second gate lines that extend in an arrangement direction of the first display part and the second display part, a plurality of second data lines that extend in a direction perpendicular to the arrangement direction, a second thin film transistor that is connected to the second gate lines and the second data lines, and a second pixel electrode that is directly or indirectly connected to the second thin film transistor, wherein each of a first gate driver supplying a gate signal to the first gate lines and a second gate driver supplying a gate signal to the second gate lines are constituted to comprise a transistor formed on one surface of the array substrate, wherein at least a part of the first gate driver and at least a part of the second gate driver are formed in a region sandwiched between the first display part and the second display part, wherein the number of the first gate lines is smaller than the number of the second gate lines, wherein a data driver supplying a data signal to the first data lines and the second data lines is disposed on one side at a near side to the first display part of two sides opposing to the arrangement direction of the array substrate with a rectangular-shape, wherein the array substrate further comprises first common leads supplying a common signal to a first opposing electrode on the opposing substrate corresponding to the first display part, and wherein a part of the first common leads is arranged in a region sandwiched between a plurality of first data line terminals and a plurality of second data line terminals on one surface of the array substrate.

3. A display device comprising:

an array substrate in which a first display part and a second display part are disposed side by side on one surface, wherein the first display part comprises a plurality of first gate lines that extend in an arrangement direction of the first display part and the second display part, a plurality of first data lines that extend in a direction perpendicular to the arrangement direction, a first thin film transistor that is connected to the first gate lines and the first data lines, and a first pixel electrode that is directly or indirectly connected to the first thin film transistor, wherein the second display part comprises a plurality of second gate lines that extend in an arrangement direction of the first display part and the second display part, a plurality of second data lines that extend in a direction perpendicular to the arrangement direction, a second thin film transistor that is connected to the second gate lines and the second data lines, and a second pixel electrode that is directly or indirectly connected to the second thin film transistor, wherein a gate driver supplying a gate signal to the first gate lines and to the second gate lines comprises a transistor formed on one surface of the array substrate, and at least a part of the gate driver is formed in a region sandwiched between the first display part and the second display part, and wherein the number of first gate lines and the number of the second gate lines are different, of a plurality of output transistors of the gate driver, both of the first gate lines and the second gate lines are connected to a part of output transistors, and either one of the first gate lines and the second gate lines are connected to remaining output transistors, and a load capacitance adjuster is connected to output transistors that are connected to either one of the first gate lines and the second gate lines.

4. A display device comprising:

an array substrate in which a first display part and a second display part are disposed side by side on one surface, wherein the first display part comprises a plurality of first gate lines that extend in an arrangement direction of the first display part and the second display part, a plurality of first data lines that extend in a direction perpendicular to the arrangement direction, a first thin film transistor that is connected to the first gate lines and the first data lines, and a first pixel electrode that is directly or indirectly connected to the first thin film transistor, wherein the second display part comprises a plurality of second gate lines that extend in an arrangement direction of the first display part and the second display part, a plurality of second data lines that extend in a direction perpendicular to the arrangement direction, a second thin film transistor that is connected to the second gate lines and the second data lines, and a second pixel electrode that is directly or indirectly connected to the second thin film transistor, wherein a gate driver supplying a gate signal to the first gate lines and to the second gate lines comprises a transistor formed on one surface of the array substrate, and at least a part of the gate driver is formed in a region sandwiched between the first display part and the second display part, and wherein the gate driver is divided in a direction perpendicular to the arrangement direction into a first gate line output unit that comprises an output transistor connected to the first gate lines and a second gate line output unit that comprises an output transistor connected to the second gate lines.

* * * * *